US012710663B2

(12) United States Patent
Fang et al.

(10) Patent No.: US 12,710,663 B2
(45) Date of Patent: Aug. 18, 2026

(54) VR VENTILATION MASK

(71) Applicant: Shenzhen Youban Zhihui Technology Limited, Guangdong (CN)

(72) Inventors: Jinhong Fang, Shenzhen (CN); Minliang Ruan, Shenzhen (CN); Zhangcai Zhu, Shenzhen (CN)

(73) Assignee: Shenzhen Youban Zhihui Technology Limited, Shenzhen (CN)

( * ) Notice: Subject to any disclaimer, the term of this patent is extended or adjusted under 35 U.S.C. 154(b) by 0 days.

(21) Appl. No.: 19/027,727

(22) Filed: Jan. 17, 2025

(65) Prior Publication Data

US 2026/0194756 A1 Jul. 9, 2026

(30) Foreign Application Priority Data

Jan. 9, 2025 (CN) ........................ 202520049156.2

(51) Int. Cl.
*G02B 27/01* (2006.01)
*H05K 7/20* (2006.01)

(52) U.S. Cl.
CPC ..... *G02B 27/0176* (2013.01); *H05K 7/20127* (2013.01)

(58) Field of Classification Search
CPC combination set(s) only.
See application file for complete search history.

(56) References Cited

U.S. PATENT DOCUMENTS 10,989,890 B1 * 4/2021 Ando .................... B22F 3/1115
11,058,026 B1 * 7/2021 Marić .................... G06F 3/011
2008/0223370 A1 * 9/2008 Kim .................... A41D 13/11 128/206.17
2017/0168303 A1 * 6/2017 Petrov .................... G02C 11/08
2017/0184863 A1 * 6/2017 Balachandreswaran .................... G02B 27/0176
2018/0098465 A1 * 4/2018 Reynolds ............. G02B 27/028
2020/0073450 A1 * 3/2020 Maric ................ G02B 27/0176
2022/0193469 A1 * 6/2022 Vanderham .......... A62B 23/025

* cited by examiner

*Primary Examiner* — William Boddie
*Assistant Examiner* — Alecia D English

(57) ABSTRACT

A VR ventilation mask includes a mask body and a baffle, where the mask body includes a shell board, a plurality of first air vents are provided on the shell board, and a side edge of each of the first air vents is provided with a rib extending towards the baffle; the baffle is provided on the mask body and is located inside the shell board, a first ventilation gap is provided between the baffle and the shell board, a plurality of first ventilation holes matching the first air vents are provided on the baffle, and the first ventilation holes are offset from the first air vents; where the first air vents, the first ventilation gap and the first ventilation holes communicate in sequence to form a stepped first light-shielding ventilation channel.

10 Claims, 15 Drawing Sheets

VR VENTILATION MASK

CROSS-REFERENCE TO RELATED APPLICATIONS

This application claims priority to Chinese Patent Application No. 202520049156.2, filed on Jan. 9, 2025, the content of which is incorporated herein by reference in its entirety.

TECHNICAL FIELD

The present application relates to the field of VR fitting technology, and more particularly to a VR ventilation mask.

BACKGROUND

In recent years, the Virtual Reality (VR) technology has been rapidly developed and widely used in entertainment, education, medical and other fields. With progress of technologies, the users place higher demands on the comfort and immersion of VR devices. The design and performance of the VR mask as a component in direct contact with a user's face directly affects the user's overall experience. However, the existing VR mask is generally only ventilated up and down, resulting in unsatisfactory ventilation and air permeable effect. After long-term use, the user tends to feel dull and uncomfortable, and it is also easy to cause fogging of the lens of the host and lens of glasses.

SUMMARY

The technical problem to be solved by the present application is to provide a VR ventilation mask to solve the problem that the ventilation and air permeable effect of the existing VR mask is not ideal.

In order to solve the above-mentioned technical problem, the technical solution adopted by the present application is a VR ventilation mask, which includes a mask body and a baffle, where the mask body includes a shell board, a plurality of first air vents are provided on the shell board, and a side edge of each of the first air vents is provided with a rib extending towards the baffle; the baffle is provided on the mask body and is located inside the shell board, a first ventilation gap is provided between the baffle and the shell board, a plurality of first ventilation holes matching the first air vents are provided on the baffle, and the first ventilation holes are offset from the first air vents; where the first air vents, the first ventilation gap and the first ventilation holes communicate in sequence to form a stepped first light-shielding ventilation channel.

Further, in the VR ventilation mask described herein, an opening of the first ventilation hole is provided toward a non-open area of the baffle and the opening of the first ventilation hole is provided toward a non-open area of the shell board, such that the first ventilation hole is offset from the first air vent.

Further, in the VR ventilation mask described herein, a long axis of the first air vent extends parallel to a vertical height of the VR ventilation mask.

Further, in the VR ventilation mask described herein, the rib includes a first rib and a second rib located on different sides of different first air vents, respectively.

Further, in the VR ventilation mask described herein, a guide is provided on the shell board, and a downward opening notch is provided on the baffle, where the guide is provided in the notch.

Further, in the VR ventilation mask described herein, it further includes a first light shield provided on the mask body, where the baffle is provided between the shell board and the first light shield, and a second ventilation gap is between the first light shield and the baffle.

Further, in the VR ventilation mask described herein, the shell board is provided with a plurality of second air vents, and ventilation ports are provided at the bottom of the baffle, where the second air vents, the first ventilation gaps, the ventilation ports and the second ventilation gaps communicate in sequence to form a second light-shielding ventilation channel.

Further, in the VR ventilation mask described herein, the mask body is provided with an upwardly opening groove, and the groove is provided in correspondence with the ventilation port.

Further, in the VR ventilation mask described herein, it further includes a connection plate and a second light shield provided on the mask body, where two ends of the connection plate are respectively connected to the shell board, a second ventilation hole is provided on the connection plate, the second light shield is located inside the connection plate, and a third ventilation gap is provided between the second light shield and the connection plate.

Further, in the VR ventilation mask described herein, a plurality of snap-fit slots are provided on the shell board, and two ends of the baffle are correspondingly inserted into the snap-fit slots, respectively.

Further, in the VR ventilation mask described herein, it further includes a nose bridge, where the nose bridge is provided on the shell board.

Further, in the VR ventilation mask described herein, a limiting block is provided on the shell board, and the baffle is correspondingly provided with a limiting slot, where the limiting block is provided in the limiting slot.

The beneficial effects of the present application are as follows: the present application provides a VR ventilation mask, aiming to solve the problem of poor ventilation and light-shielding performance of the existing VR mask. The VR ventilation mask includes a shell board and a baffle which are arranged at intervals of a first ventilation gap, where a plurality of first air vents are provided on the shell board, and the first air vents can be used for communicating the air in the first ventilation gap with the external air. Accordingly, the first ventilation holes are provided on the baffle, so that the baffle can also achieve ventilation and air permeability on the basis of light-shielding, i.e., the air in the first ventilation gap can communicate with the internal air of the VR ventilation mask. That is to say, on the basis of the above-mentioned first air vents, first ventilation gaps and first ventilation holes which are in communication in sequence, corresponding first light-shielding ventilation channels can be formed, and internal and external ventilation and air permeability of the VR ventilation mask can be realized via the first light-shielding ventilation channels, so that the ventilation performance of the mask can be effectively improved, and then the fogging of the lens of the host and the lens of the glasses can be effectively reduced. Further, since the first light-shielding ventilation channel is of a stepped structure, it can be effectively ensured that the front light irradiated inward by the light through the first air vent is blocked by the baffle, thereby ensuring the light-shielding performance of the mask.

DESCRIPTION OF REFERENCE NUMERALS

1. mask body; 11. groove; 12. connection plate; 13. second light shield; 14. second ventilation hole; 15. third ventilation gap; 16. limiting protrusion;
2. shell board; 21. first air vent; 22. second air vent; 23. first rib; 24. second rib; 25. guide; 26. snap-fit slot; 27. limiting block;
3. baffle; 31. first ventilation hole; 32. ventilation port; 33. notch; 34. limiting slot;
4. first ventilation gap;
5. first light shield;
6. second ventilation gap;
7. nose bridge.

DETAILED DESCRIPTION OF THE EMBODIMENTS

In order to explain the technical contents, the objects, and the effects of the present application in detail, the embodiments will be described below referring to the accompanying drawings.

VR ventilation masks in the existing market usually ventilate only up and down, the ventilation area is less than ⅓ of the peripheral area, the ventilation and air permeable is not ideal, causing fogging of the lens of the host and lens of glasses after the VR ventilation masks are used. For the above-mentioned problems, in the present application, a ventilation grid is opened to the maximum, and at the same time of light-shielding, a fully surrounding and omnibearing ventilation and air permeable structure is also achieved.

Figure 1:
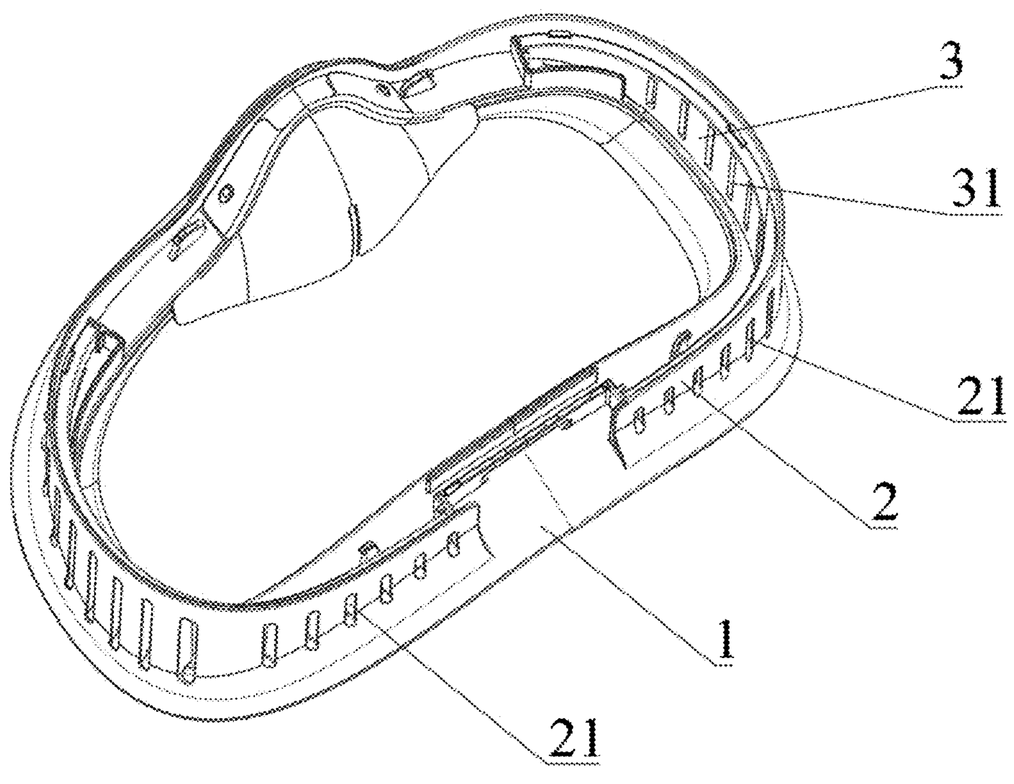
FIG. 1 is a schematic structural diagram showing a VR ventilation mask described herein from one perspective according to one embodiment.
Figure 2:
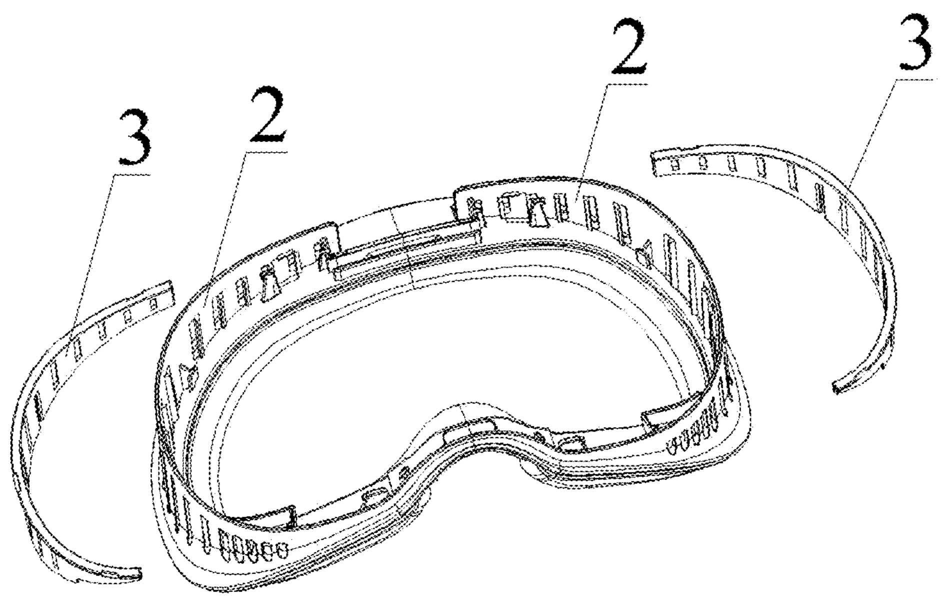
FIG. 2 is a structural exploded view of a VR ventilation mask described herein from one perspective according to one embodiment.

Referring to FIGS. 1 and 2, the present application provides a VR ventilation mask, which includes a mask body 1 and a baffle 3, where the mask body includes a shell board 2, a plurality of first air vents 21 are provided on the shell board 2, and a side edge of each of the first air vents 21 is provided with a rib extending towards the baffle 3; the baffle 3 is provided on the mask body and is located on an inner side wall of the shell board 2, a first ventilation gap 4 is provided between the baffle 3 and the shell board 2, a plurality of first ventilation holes 31 matching the first air vents 21 are provided on the baffle 3, and the first ventilation holes 31 are offset from the first air vents 21, where the first air vents 21, the first ventilation gaps 4 and the first ventilation holes are in communication in sequence to form a stepped first light-shielding ventilation channel. The mask body generally resembles an annular structure to form one viewing port, and the inner side is a side adjacent to the viewing port.

It can be seen from the above description that the beneficial effects of the present application are as follows: the present application provides a VR ventilation mask, aiming to solve the problem of poor ventilation and light-shielding performance of the existing VR mask. The VR ventilation mask includes a shell board 2 and a baffle 3 which are arranged at intervals of a first ventilation gap 4, where a plurality of first air vents 21 are provided on the shell board 2, and the first air vents 21 can be used for communicating the air in the first ventilation gap 4 with the external air. Accordingly, the first ventilation holes 31 are provided on the baffle 3, so that the baffle 3 can also achieve ventilation and air permeable on the basis of light-shielding, i.e., the air in the first ventilation gap 4 can communicate with the internal air of the VR ventilation mask. It should be noted that the ribs may block the air in the first ventilation gap, for example, to allow the air to efficiently enter the first ventilation hole.

That is to say, on the basis of the above-mentioned first air vents 21, first ventilation gaps 4 and first ventilation holes 31 which are in communication in sequence, corresponding first light-shielding ventilation channels can be formed, and internal and external ventilation and air permeability of the VR ventilation mask can be realized via the first light-shielding ventilation channels, so that the ventilation performance of the mask can be effectively improved, and then the fogging of the lens of the host and the lens of the glasses can be effectively reduced. Further, since the first light-shielding ventilation channel is of a stepped structure, it can be effectively ensured that the front light irradiated inward by the light through the first air vent 21 is blocked by the baffle 3, thereby ensuring the light-shielding performance of the mask.

Further, in the VR ventilation mask described herein, an opening of the first ventilation hole is provided toward a non-open area of the baffle and the opening of the first ventilation hole is provided toward a non-open area of the shell board, such that the first ventilation hole is offset from the first air vent.

Figure 10:
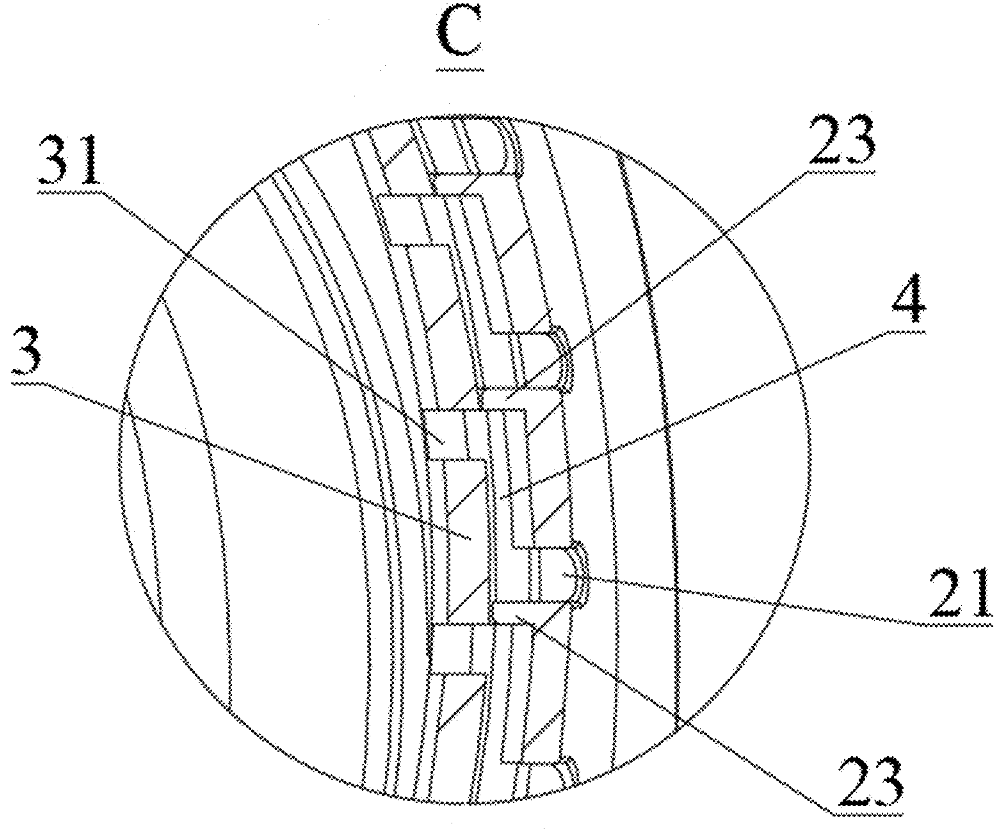
FIG. 10 is a partially enlarged view at C of a VR ventilation mask as shown in FIG. 7.
Figure 11:
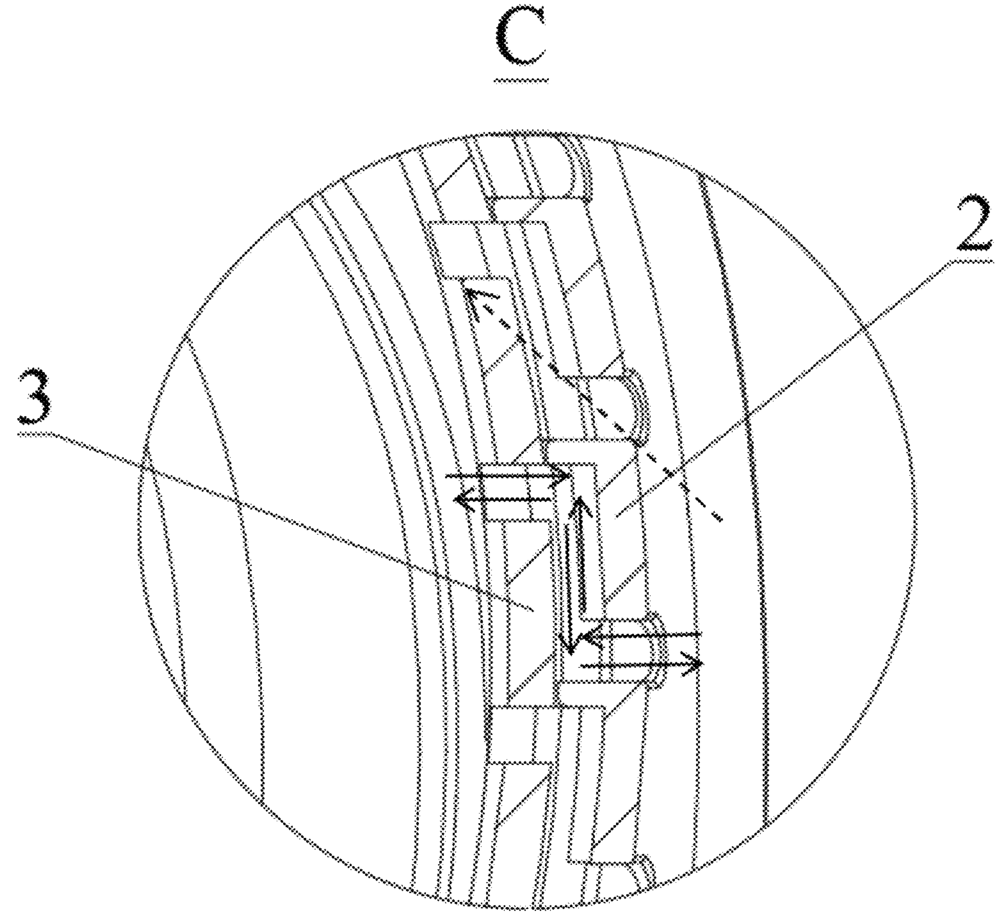
FIG. 11 is a partially enlarged view at C of a VR ventilation mask as shown in FIG. 7.

In practice, as shown in FIGS. 10 and 11, a solid line with an arrow in FIG. 11 shows an air flow path in which air flows in the first light-shielding ventilation channel shown in FIG. 11, it is possible to effectively ensure ventilation and air permeability inside and outside of the VR ventilation mask. Since the first air vents and the first ventilation holes are arranged offset, i.e., staggered, openings of the first air vents and the first ventilation holes are not directly opposite, the openings of the first air vents 21 face the non-open area of the baffle 3, and the openings of the first ventilation holes 31 face the non-open area of the shell board 2, so that the lights irradiated inwards by the lights through the first air vents are blocked by the baffle, and the dotted line in FIG. 11 is the light connecting line at the farthest end between the first air vents and the first ventilation holes, and the lights are also blocked by the baffle; therefore, the light entering from the outside through the first air vents can be effectively blocked to achieve a light-shielding effect.

It should be noted that the VR ventilation mask has a vertical height that approximates the fore-aft direction of the human body when the VR ventilation mask is worn on the human body. The extension direction of a long axis of the above-mentioned first air vent is parallel to the vertical height direction; the size (such as the extension length in the vertical height direction) of the above-mentioned first air vent 21 is adapted to the size of the shell board 2; the extension length of the first air vent 21 is correspondingly increased at the position where the shell board 2 has a larger area; and the extension length of the first air vent 21 is correspondingly increased at the position where the shell board 2 has a smaller area. In practice, the inner wall surface of the first air vent 21 may be beveled for better demolding, and in some embodiments, the first air vent 21 may be funnel-shaped on the whole as viewed along the vent depth.

Figure 14:
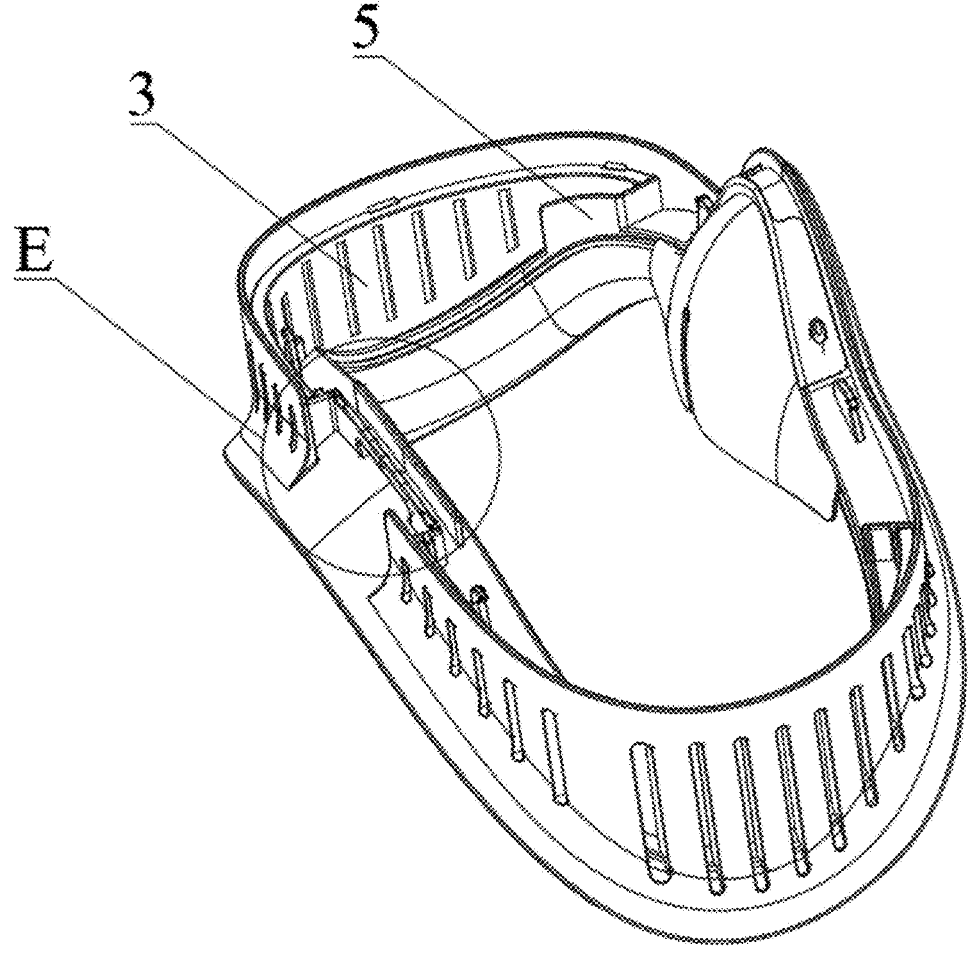
FIG. 14 is a schematic structural diagram showing a shell board in a VR ventilation mask described herein from yet another perspective according to one embodiment.

Further, as shown in FIG. 14, the VR ventilation mask of the present application further includes a first light shield 5, where the first light shield 5 is provided on the mask body 1, the first light shield 5 is located inside the baffle 3, i.e., the baffle is provided between the shell board and the first light shield, and a second ventilation gap 6 is provided between the first light shield 5 and the baffle 3.

In practice, providing a corresponding first light shield 5 can achieve a light-shielding function, for example, light from the second ventilation gap 6, the groove 11 and the second air vent 22 can be blocked by the first light shield 5, thereby achieving a light-shielding effect.

Figure 18:
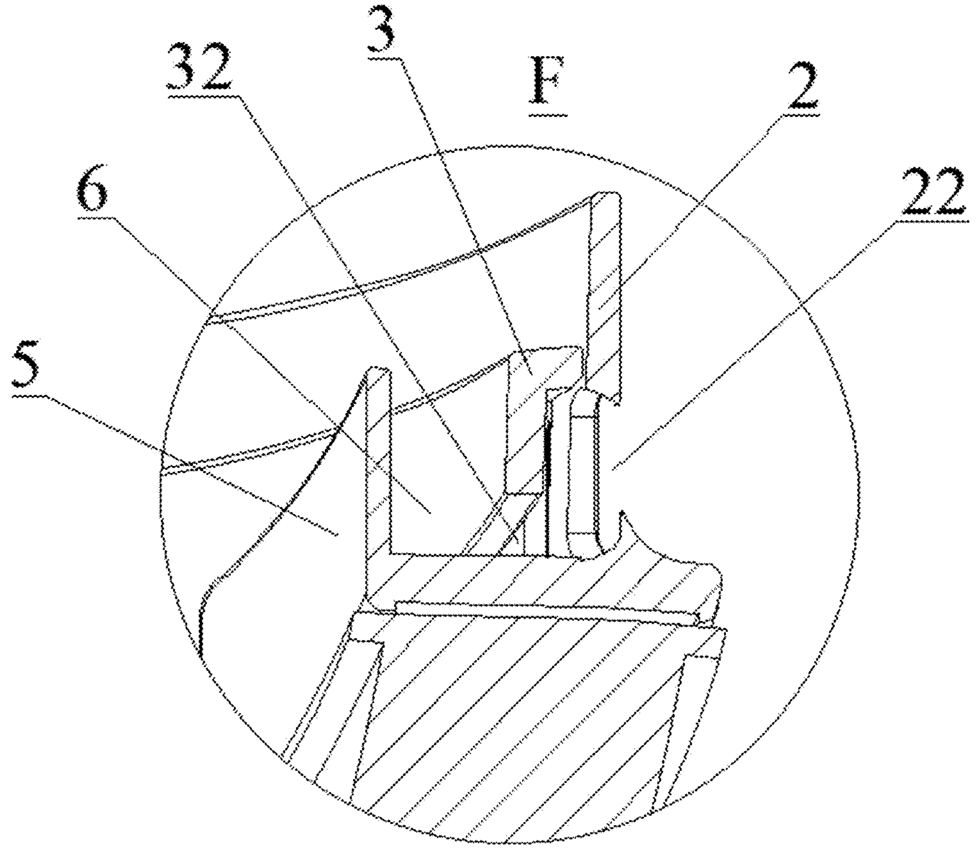
FIG. 18 is a partially enlarged view at F of the VR ventilation mask as shown in FIG. 17.

Further, as shown in FIG. 18, in the VR ventilation mask described herein, a plurality of second air vents 22 are provided on the shell board 2, and a ventilation port 32 is provided at the bottom of the baffle 3, where the second air vents 22, the first ventilation gap 4, the ventilation port 32 and the second ventilation gap 6 are in communication in sequence to form a second light-shielding ventilation channel. It should be noted that the ventilation port 32 may be a port opened at the bottom of the baffle through which air can flow.

In practice, the second air vent 22 can be used for communicating the air in the first ventilation gap 4 with the external air, and the baffle 3 can block part of the light from the second air vent 22. The baffle 3 is provided with a ventilation port 32, and a second ventilation gap 6 is provided between the baffle 3 and the first light shield 5; the ventilation port 32 enables air to flow between the first ventilation gap 4 and the second ventilation gap 6, and the second ventilation gap 6 enables air to flow inside the VR ventilation mask. That is to say, the above-mentioned second air vents, the first ventilation gap 4, the ventilation port 32 and the second ventilation gap 6 are in communication in sequence to form a second light-shielding ventilation channel similar to a convex/concave structure, and internal and external ventilation and air permeability of the VR ventilation mask can be realized via the second light-shielding ventilation channels, so that the air permeable performance of the mask can be effectively improved, and then the fogging of the lens of the host and the lens of the glasses can be effectively reduced.

Figure 19:
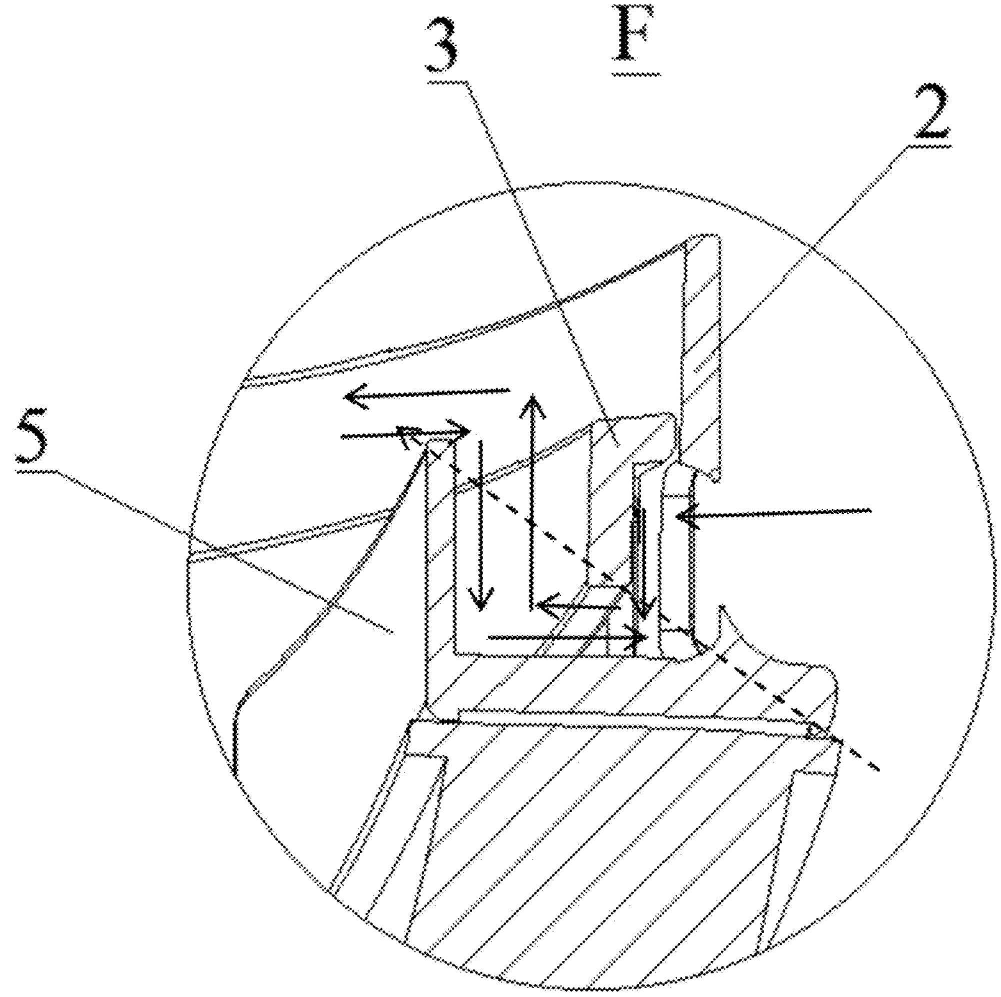
FIG. 19 is a partially enlarged view at F of the VR ventilation mask as shown in FIG. 17.

In practice, as shown in FIG. 19, a solid line with an arrow in FIG. 19 shows an air flow path in which air flows in the second light-shielding ventilation channel shown in FIG. 19, it is possible to effectively ensure ventilation and air permeability inside and outside of the VR ventilation mask. As shown in FIG. 19, part of the light coming from the second air vent can be blocked by the baffle, and part of the light can be blocked by the second light shield, so as to achieve a light-shielding effect; and the dotted line to be an arrow in FIG. 19 is a light path corresponding to the connecting line between the bottom end of the second ventilation hole and the top of the first light shield, and this light can be effectively blocked by the first light shield, and therefore, external light which is not blocked by the baffle can be effectively blocked by the first light shield, so as to achieve a light-shielding effect.

Figure 4:
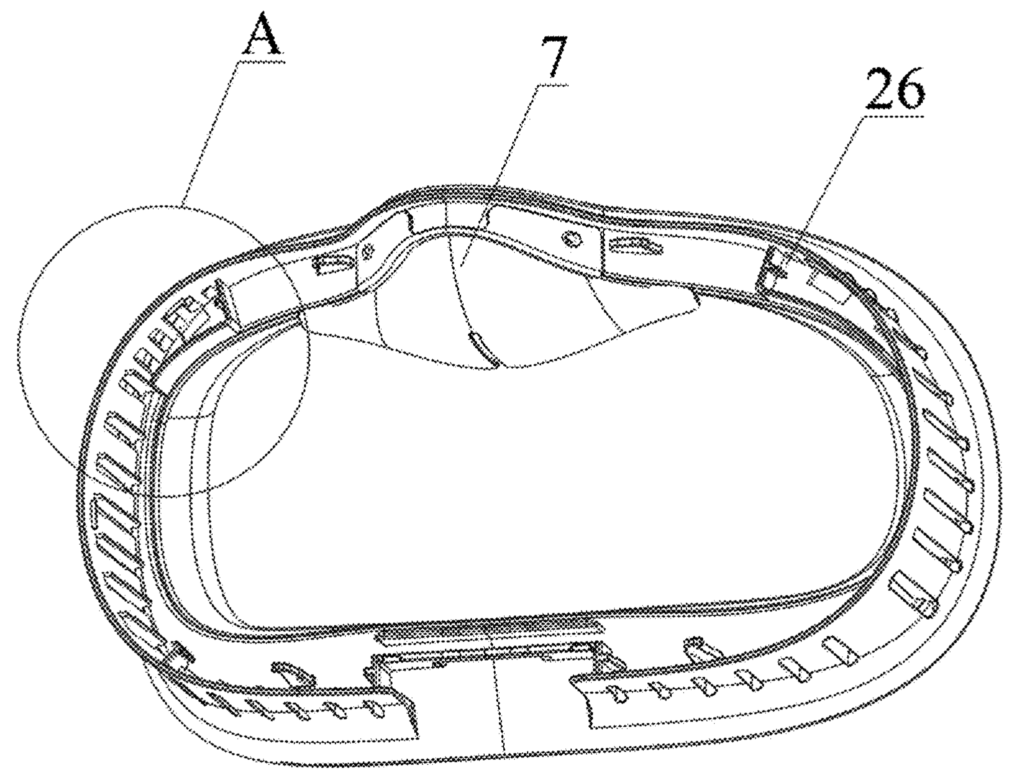
FIG. 4 is a schematic structural diagram showing a shell board of a VR ventilation mask described herein from one perspective according to one embodiment.
Figure 7:
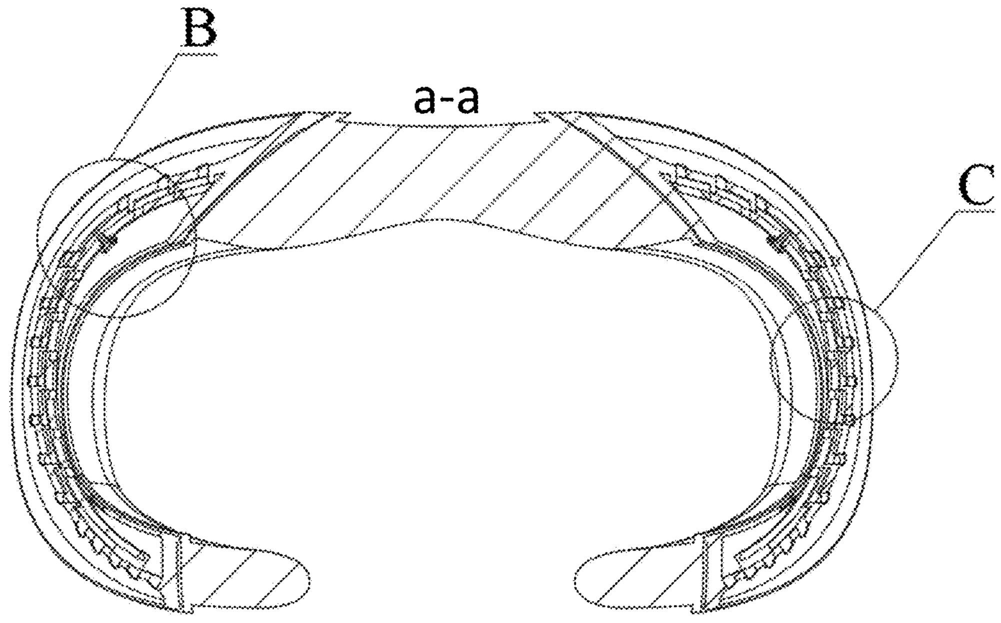
FIG. 7 is an a-a cross-sectional schematic diagram showing a VR ventilation mask as shown in FIG. 6.

In addition, it should be noted that, in practice, the above-mentioned first light-shielding ventilation channel corresponding structure may be arranged at a position where a space structure is sufficient, as shown in FIGS. 1 and 7, may be arranged at two sides of the VR ventilation mask and at a position near an upper end of the VR ventilation mask; in contrast, the above-mentioned second light-shielding ventilation channel corresponding structure may be arranged at a position where the space is relatively limited, and as shown in FIGS. 4 and 7, the second light-shielding ventilation channel corresponding structure may be arranged at two sides of the nose bridge 7.

Figure 5:
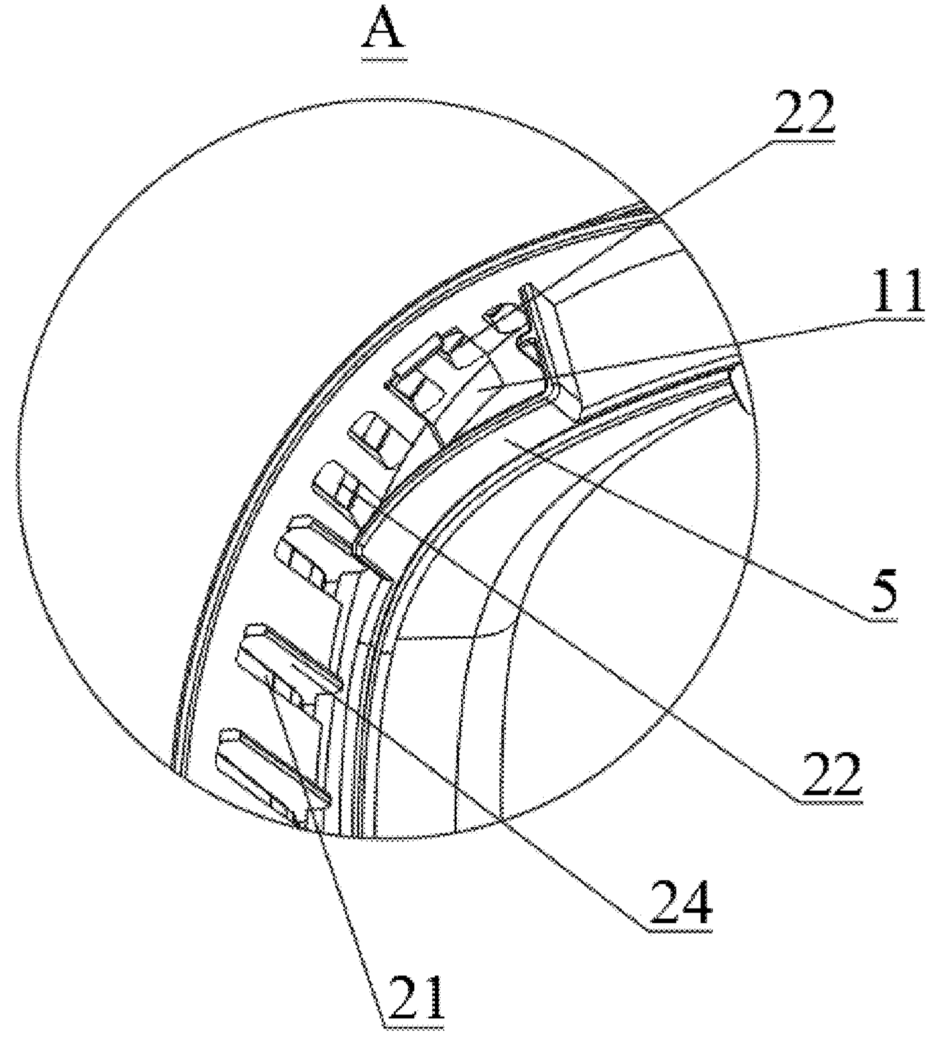
FIG. 5 is a partially enlarged schematic diagram at A of the shell board as shown in FIG. 4.
Figure 6:
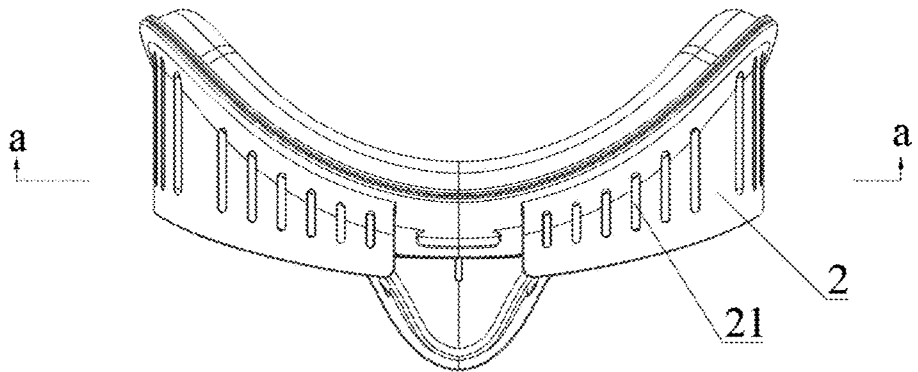
FIG. 6 is a schematic structural diagram showing a VR ventilation mask described herein from another perspective according to one embodiment.

Further, as shown in FIG. 5, in the VR ventilation mask described herein, the mask body 1 is provided with an upwardly opening groove 11, and the groove 11 is provided in correspondence with the ventilation port 32.

It can be seen from the above-mentioned description that a corresponding groove 11 is provided so as to facilitate air circulation between the first ventilation gap 4 and the second ventilation gap 6, and facilitate ventilation and air permeability.

Figure 3:
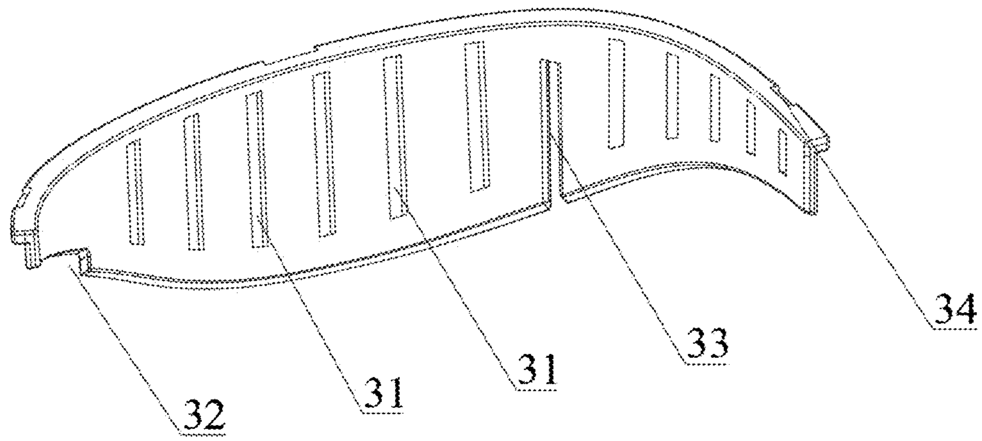
FIG. 3 is a schematic structural diagram showing a baffle in a VR ventilation mask described herein from one perspective according to one embodiment.
Figure 8:
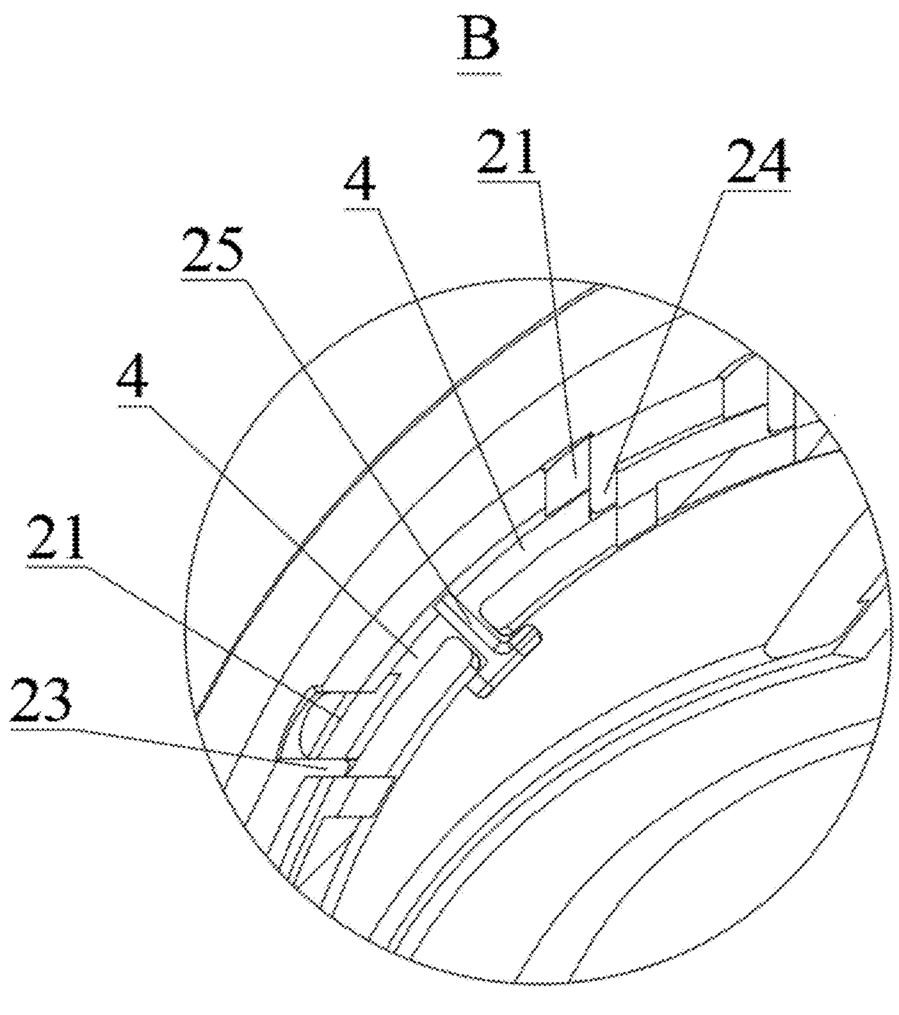
FIG. 8 is a partially enlarged view at B of a VR ventilation mask as shown in FIG. 7.
Figure 12:
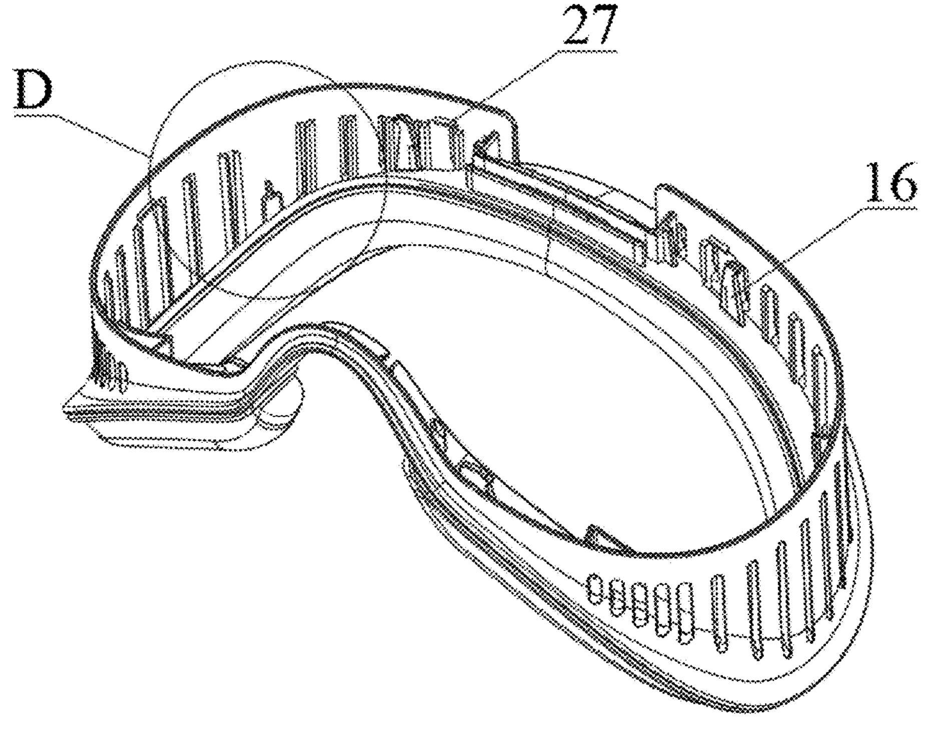
FIG. 12 is a schematic structural diagram showing a shell board in a VR ventilation mask described herein from another perspective according to one embodiment.

Further, as shown in FIGS. 3, 8 and 12, in the VR ventilation mask described herein, a guide 25 is provided on the shell board 2, and a notch 33 with a downward opening is provided on the baffle 3, where the guide 25 is provided in the notch 33.

It can be seen from the above-mentioned description that a corresponding guide 25 is provided, and when the baffle 3 is installed, the baffle 3 can be quickly installed via the cooperation of the notch 33 and the guide 25, and after the installation, the guide 25 can also limit the baffle 3. In addition, it should be noted that the above-mentioned guide 25 also has a foolproof function, and in practice, two baffles 3 are provided on the VR ventilation mask, and the two baffles 3 are similar in structure, so that when installing the two baffles 3 which are easy to be assembled and retrofitted, while in this solution, corresponding guides 25 are provided at symmetrical positions of the two shell boards 2, and the baffles 3 can be accurately and quickly installed on the corresponding mask body 1 through the cooperation of the guides 25 and the notch 33, so as to prevent the baffles 3 from being misassembled.

Figure 13:
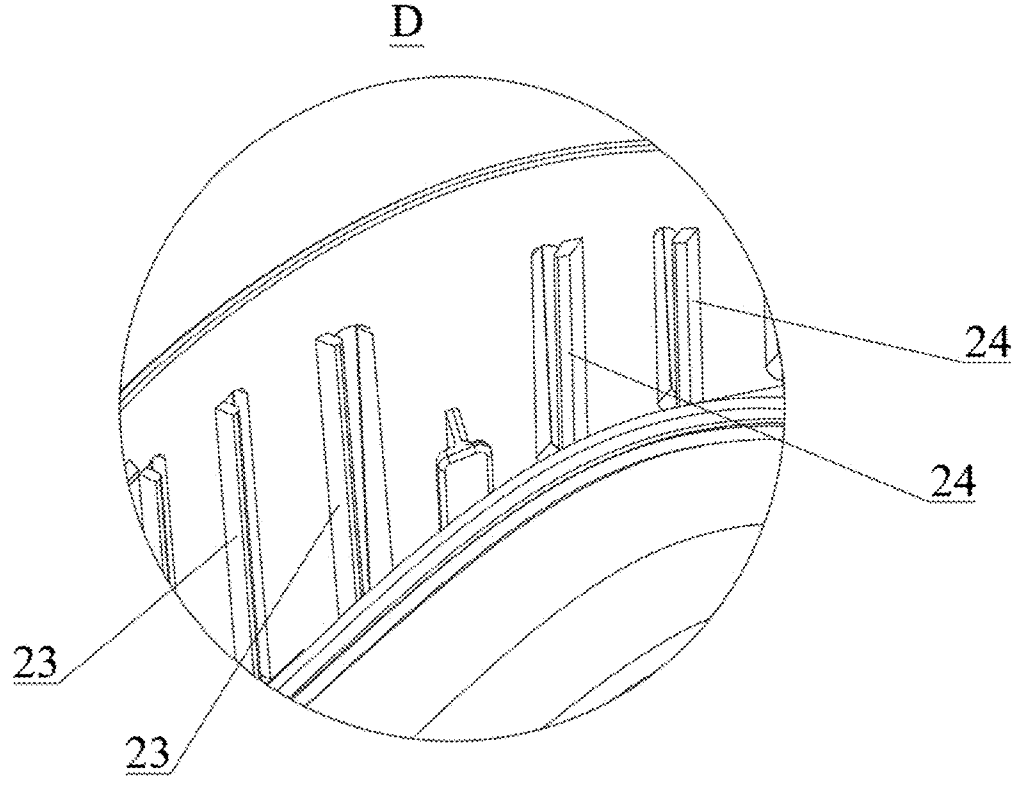
FIG. 13 is a partially enlarged schematic diagram at D of a shell board as shown in FIG. 12.

Further, as shown in FIG. 13, in the VR ventilation mask described herein, the rib includes a first rib and a second rib located on different sides of different first air vents, respectively.

In practice, the first rib 23 differs from the second rib 24 mainly in the position thereof with respect to the first air vent 21, since the guide 25 is located at an intermediate position on the shell board 2, as shown in FIG. 8, both the first rib 23 and the second rib 24 are located on a side of the first air vent 21 away from the guide 25. The first ribs 23 on the left side of the guide 25 are all left ribs, i.e., the first ribs 23 are located on the left side of the corresponding first air vents 21, and the second ribs 24 on the right side of the guide 25 are all right ribs, i.e., the second ribs 24 are located on the right side of the corresponding first air vents 21.

For the left and right ribs nearest to the guide 25, it is specified that: as shown in FIG. 13, one side of the guide 25 is a first rib 23, and the other side of the guide 25 is a second rib 24; therefore, both the left and right first air vents 21 nearest to the guide 25 communicate with the U-shaped notch 33 via the first ventilation gap 4, that is to say, in the present solution, on the basis of using the U-shaped notch U-shaped notch for guiding and limiting, further using the U-shaped notch for ventilation and air permeability, so that the shell board 2 can be provided with more first air vents 21 to further improve the ventilation and air permeable performance of the VR ventilation mask. It should be noted that the U-shaped notch is penetrated by the guide near the opening, and the space where the U-shaped notch is not inserted by the guide is available for air circulation. The design of the left and right ribs has the following effects: when light enters from different angles, it is beneficial to be blocked. Taking FIGS. 8 and 9 as an example, when the light enters at a large angle with respect to the first air vent from the lower left to the upper right, the light entering from the first air vents on the left side is blocked by the baffle 2 located in the first ventilation gap 4, and the light entering from the first air vent on the right side is blocked by the second rib 24 of the first air vent on the right side. When the light enters at a large angle with respect to the first air vent from the upper right to the lower left, the light entering from the first air vent on the right side is blocked by the baffle 2 located in the first ventilation gap 4, and the light entering from the first air vent on the left side is blocked by the first rib 23 of the first air vent on the left side. Therefore, because of the arrangement of the first rib and the second rib, it can be ensured that when lights of different angles are incident at a large angle, both can be blocked by the cooperation of the ribs and the baffle. Other lights incident at a small angle with respect to the first air vent are easily blocked by a blocking plate.

Figure 9:
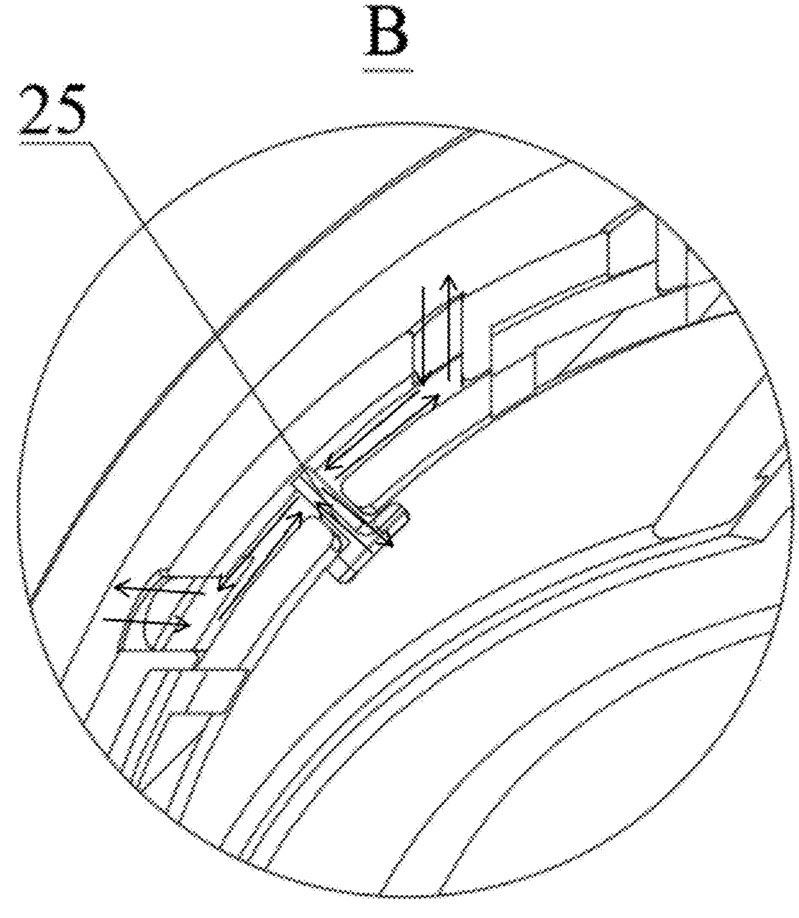
FIG. 9 is a partially enlarged view at B of a VR ventilation mask as shown in FIG. 7.

In practice, the two right and left first air vents 21 which are closest to the guide 25 in the above-mentioned notch can communicate with each other via the first ventilation gap 4, so as to constitute a fourth light-shielding ventilation structure, and further improve the ventilation and air permeable performance of the VR ventilation mask inside and outside. As shown in FIG. 9, a solid line with an arrow in FIG. 9 shows an air flow path in which air flows in the fourth light-shielding ventilation channel shown in FIG. 9, it is possible to effectively ensure ventilation and air permeability inside and outside of the VR ventilation mask.

Figure 15:
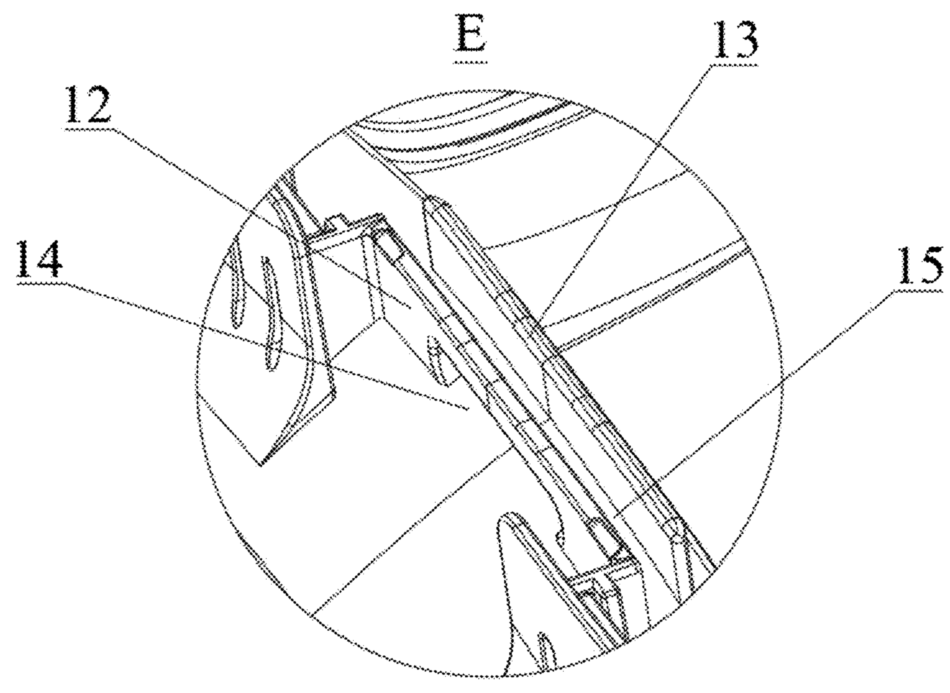
FIG. 15 is a partially enlarged view at E of the shell board as shown in FIG. 14.
Figure 16:
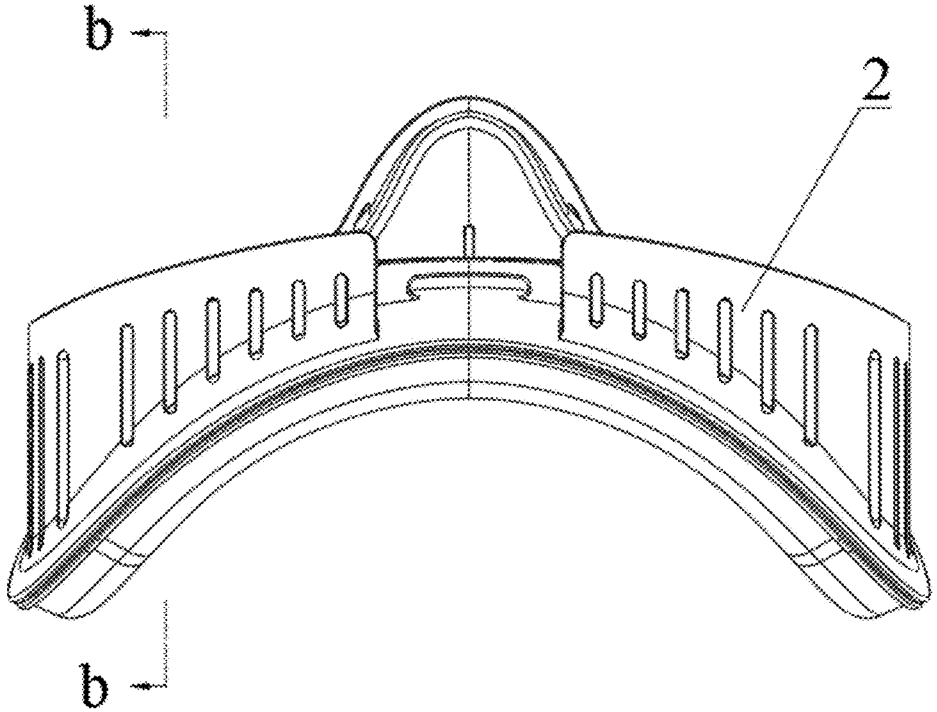
FIG. 16 is a schematic structural diagram showing a VR ventilation mask described herein from another perspective according to one embodiment.
Figure 17:
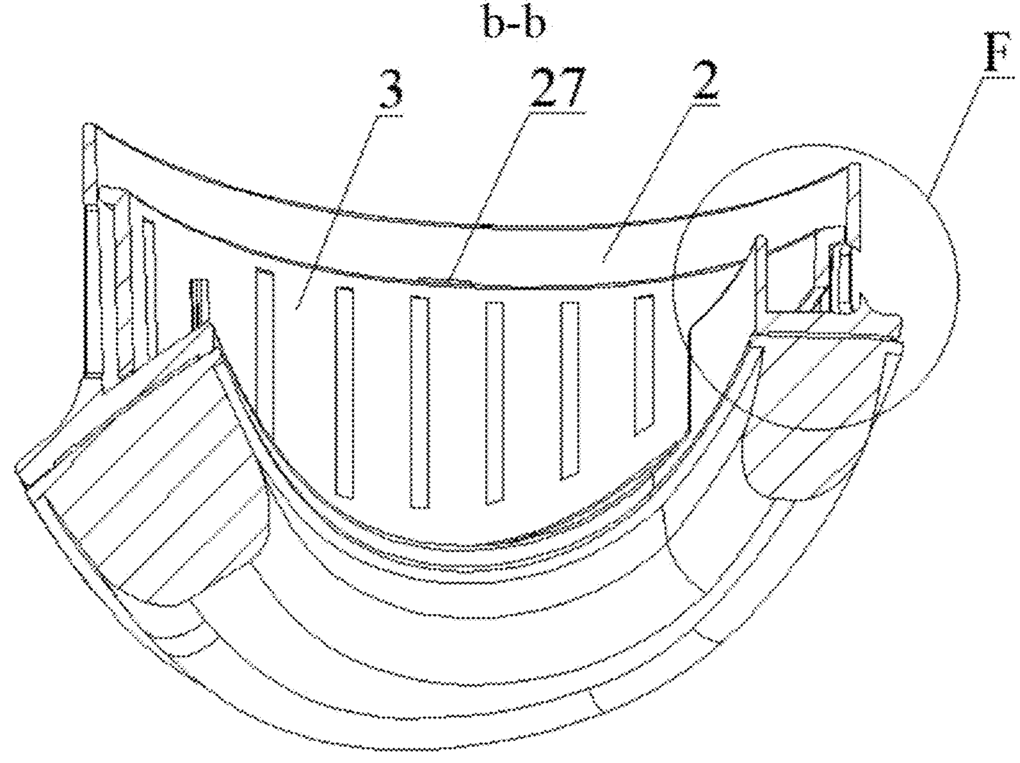
FIG. 17 is a cross-sectional schematic diagram showing the VR ventilation mask as shown in FIG. 16 taken along line b-b.

Further, as shown in FIG. 15, the VR ventilation mask of the present application further includes a connection plate 12 and a second light shield 13 provided on the mask body 1, where two ends of the connection plate 12 are respectively connected to the shell board 2, a second ventilation hole 14 is provided on the connection plate 12, the second light shield 13 is located inside the connection plate 12, and a third ventilation gap 15 is provided between the second light shield 13 and the connection plate 12.

In practice, the overall structure of the shell board 2 may be an arc-shaped structure, two ends of the arc-shaped structure thereof may be connected via a connection plate 12, and a second ventilation hole 14 is provided on the connection plate 12; accordingly, in order to shield the light of the second ventilation hole 14, a second light shield 13 is designed on the inner side of the connection plate 12, and the second light shield 13 is provided on the mask body 1. On this basis, in order to ensure that ventilation and air permeability can be effectively performed through the second ventilation hole 14, the present application also provides that a third ventilation gap 15 is provided between the second light shield 13 and the connection plate 12, and a third light-shielding ventilation channel can be formed through the third ventilation gap 15 and the second ventilation hole 14.

Further, as shown in FIG. 4, in the VR ventilation mask described herein, a plurality of snap-fit slots 26 are provided on the shell board 2, and two ends of the baffle 3 are respectively inserted into the snap-fit slots 26.

It can be seen from the above-mentioned description that a plurality of snap-fit slots 26 are provided on the shell board 2 to clamp the baffle 3 so as to prevent it from moving. Further, corresponding snap-fit slots 26 are provided, which facilitates a quick mounting of the baffle 3 when the baffle 3 is mounted.

Further, as shown in FIG. 4, in the VR ventilation mask described herein, a nose bridge 7 is further included and provided on the shell board 2.

It can be seen from the above-mentioned description that a nose bridge 7 is provided in the VR ventilation mask, and the nose bridge 7 can fit on two sides of the nose bridge of a user, on the one hand, it can facilitate the wearing of the VR ventilation mask, and on the other hand, it can effectively prevent external light from entering from the gap between the nose and the mask, so as to reduce the light leakage, thereby improving the immersion of the virtual reality experience.

Further, as shown in FIGS. 3 and 12, in the VR ventilation mask described herein, a limiting block 27 is provided on the shell board 2, and the baffle 3 is correspondingly provided with a limiting slot 34, where the limiting block 27 is provided in the limiting slot 34.

It can be seen from the above-mentioned description that the baffle 3 can be limited and prevented from moving by the cooperation between the limiting block 27 and the limiting slot 34. In addition, the mask body 1 may be provided with a corresponding limiting protrusion 16 to further limit the baffle 3.

In addition, in some embodiments, a corresponding light-shielding pad may also be provided at the bottom of the baffle 3 in contact with the mask body 1, with which light-shielding effect is further enhanced. Of course, a corresponding fan may be provided on the VR ventilation mask to further enhance the ventilation effect, for example, a corresponding fan may be provided in the first air vent 21.

Referring to FIGS. 1 to 19, the first embodiment of the present application is: a VR ventilation mask includes a mask body 1 and a baffle 3. As shown in FIG. 2, the overall structure of the mask body 1 is similar to an annular structure, and the left and right sides thereof are symmetrically arranged; a nose bridge 7 is provided below the mask body 1; the mask body 1 includes a shell board 2 which is overall similar to an arc structure, and a connection plate 12 is provided between the two ends of the shell board 2, and the connection plate 12 connects the two ends of the shell board 2 so as to form an annular structure. Two baffles 3 are further symmetrically arranged on the mask body 1, as shown in FIG. 1, the two baffles 3 are located on the inner side of the shell board 2, and the baffles 3 will be snap-fit connected to the shell board 2.

In the present embodiment, as shown in FIGS. 3, 4, 5, 10 and 11, a plurality of first air vents 21 are provided on the shell board 2, a side edge of each first air vent 21 is provided with a rib extending towards the baffle 3, and correspondingly, a first ventilation gap 4 is provided between the baffle 3 and the shell board 2, a plurality of first ventilation holes 31 cooperating with the first air vents 21 are provided on the baffle 3, and the first ventilation holes 31 are arranged offset from the first air vents 21, where the first air vents 21, the first ventilation gaps 4 and the first ventilation holes 31 are in communication successively so as to form a stepped first light-shielding ventilation channel.

In the present embodiment, as shown in FIGS. 4, 17, 18 and 19, a nose bridge is provided at the lower part of the VR ventilation mask, and a second light-shielding ventilation structure is provided at two side positions near the nose bridge 7. Specifically, the above-mentioned VR ventilation mask further includes a first light shield 5 connected to the shell board 2, the first light shield 5 is provided on the mask body 1, the first light shield 5 is located inside the baffle 3, and a second ventilation gap 6 is provided between the first light shield 5 and the baffle 3. Accordingly, a plurality of second air vents 22 are provided on the shell board 2, and a ventilation port 32 is provided at the bottom of the baffle 3, where the second air vents, the first ventilation gap 4, the ventilation port 32 and the second ventilation gap 6 are in communication successively so as to form a second light-shielding ventilation channel. In addition, a groove 11 is provided in the mask body 1 at a position corresponding to the ventilation port 32 to further facilitate ventilation and air permeability.

In the present embodiment, as shown in FIGS. 14 and 15, a third light-shielding ventilation structure is further provided on an upper part of the VR ventilation mask, the third light-shielding ventilation structure is connected to a structure corresponding to the first light-shielding ventilation channel, the third ventilation light-shielding structure includes a connection plate 12 and a second light shield 13 provided on the mask body 1, two ends of the connection plate 12 are respectively connected to the shell board 2, a second ventilation hole 14 is provided on the connection plate 12, the second light shield 13 is located inside the connection plate 12, and a third ventilation gap 15 is provided between the second light shield 13 and the connection plate 12. A third light-shielding ventilation channel can be formed by the third ventilation gap 15 and the second ventilation hole 14.

In the present embodiment, as shown in FIGS. 3, 7, 8 and 9, in order to facilitate the detachable mounting of the baffle 3, a guide 25 is provided on the shell board 2, and the baffle 3 is provided with a notch 33 with a downward opening, and the guide 25 is inserted into the notch 33 during mounting to facilitate accurate mounting. On this basis, in order to make the air-permeable structure as large as possible, the notch 33 can be used for ventilation and air-permeability, and for this purpose, the position of the rib of the first air vent 21 can be set so that the first/second rib located on a side of the first air vent 21 can be located on a side away from the guide 25. At this time, the two right and left first air vents 21 which are closest to the guide 25 in the above-mentioned notch can communicate with each other via the first ventilation gap 4, so as to constitute a fourth light-shielding ventilation structure, and further improve the ventilation and air permeable performance of the VR ventilation mask inside and outside.

In summary, providing the corresponding first light-shielding ventilation channel, second light-shielding ventilation channel, third light-shielding ventilation channel and fourth light-shielding ventilation structure can enable the VR ventilation mask of the present application to fully surround the omnibearing ventilation and air permeability, with the ventilation area being close to half of the peripheral area.

In summary, for the VR ventilation mask provided by the present application: the ventilation grid is opened to the maximum, so as to achieve light shielding, and at the same time, a fully surrounding omnibearing ventilation and air permeable structure is also realized, with the ventilation area being close to half of the peripheral area, thereby reducing the fogging of the lens of the host and the lens of the glasses.

The above-mentioned embodiments are merely examples of the present application and are not intended to limit the scope of the present application, and all changes which come within the meaning and range of equivalence of the present application and the appended claims are to be embraced within their scope.

The invention claimed is:

1. A VR ventilation mask, comprising a mask body and a baffle, wherein the mask body comprises a shell board, a plurality of first air vents are provided on the shell board, and a side edge of each of the first air vents is provided with a rib extending towards the baffle; the rib comprises a first rib and a second rib located on different sides of different first air vents, respectively; the baffle is provided on the mask body and is located inside the shell board, a first ventilation gap is provided between the baffle and the shell board, a plurality of first ventilation holes matching the first air vents are provided on the baffle, and an opening of the first air vents is provided toward a non-open area of the baffle and the opening of the first ventilation hole is provided toward a non-open area of the shell board, such that the first ventilation holes are offset from the first air vents; wherein the rib is located in the first ventilation gap and is offset from the first ventilation hole, and the rib is positioned on side of the first air vents away from the first ventilation hole; the first air vents, the first ventilation gap and the first ventilation holes communicate in sequence to form a stepped first light-shielding ventilation channel.

2. The VR ventilation mask according to claim 1, wherein a long axis of the first air vent extends parallel to a vertical height of the VR ventilation mask.

3. The VR ventilation mask according to claim 2, wherein the mask body is provided with an upwardly opening groove, and the groove is provided in correspondence with the ventilation port.

4. The VR ventilation mask according to claim 1, wherein a guide is provided on the shell board, and a downward opening notch is provided on the baffle, wherein the guide is provided in the notch.

5. The VR ventilation mask according to claim 1, further comprising a first light shield provided on the mask body, wherein the baffle is provided between the shell board and the first light shield, and a second ventilation gap is between the first light shield and the baffle.

6. The VR ventilation mask according to claim 1, wherein the shell board is provided with a plurality of second air vents, and ventilation ports are provided at the bottom of the baffle, wherein the second air vents, the first ventilation gaps, the ventilation ports and the second ventilation gaps communicate in sequence to form a second light-shielding ventilation channel.

7. The VR ventilation mask according to claim 1, further comprising a connection plate and a second light shield provided on the mask body, wherein two ends of the connection plate are respectively connected to the shell board, a second ventilation hole is provided on the connection plate, the second light shield is located inside the connection plate, and a third ventilation gap is provided between the second light shield and the connection plate.

8. The VR ventilation mask according to claim 1, wherein a plurality of snap-fit slots are provided on the shell board, and two ends of the baffle are correspondingly inserted into the snap-fit slots, respectively.

9. The VR ventilation mask according to claim 1, further comprising a nose bridge, wherein the nose bridge is provided on the shell board.

10. The VR ventilation mask according to claim 1, wherein a limiting block is provided on the shell board, and the baffle is correspondingly provided with a limiting slot, wherein the limiting block is provided in the limiting slot.

* * * * *